United States Patent [19]

Kraft et al.

[11] 4,043,849

[45] Aug. 23, 1977

[54] PLANAR DIFFUSION METHOD FOR AN I²L CIRCUIT INCLUDING A BIPOLAR ANALOG CIRCUIT PART

[75] Inventors: Wolfgang Kraft; Lothar Blossfeld, both of Freiburg, Germany

[73] Assignee: ITT Industries, Inc., New York, N.Y.

[21] Appl. No.: 625,339

[22] Filed: Oct. 23, 1975

[30] Foreign Application Priority Data

Nov. 8, 1974  Germany ............................. 2453134

[51] Int. Cl.² ................... H01L 21/22; H01L 21/265; H01L 29/72
[52] U.S. Cl. ...................................... 148/187; 29/577; 29/578; 148/1.5; 148/175; 357/35; 357/36; 357/44; 357/46; 357/48
[58] Field of Search ......................... 148/175, 187, 1.5; 357/44, 46, 48, 35, 36; 29/577, 578

[56] References Cited

U.S. PATENT DOCUMENTS

| | | | |
|---|---|---|---|
| 3,551,221 | 12/1970 | Yanagawa ............................. | 148/175 |
| 3,560,278 | 2/1971 | Sanera ..................................... | 148/187 |
| 3,566,218 | 2/1971 | Widlar et al. .......................... | 357/46 X |
| 3,655,457 | 4/1972 | Duffy et al. ............................. | 148/1.5 |
| 3,898,107 | 8/1975 | Polinsky .................................. | 148/1.5 |
| 3,928,081 | 12/1975 | Marley et al. .......................... | 148/1.5 |
| 3,933,528 | 1/1976 | Sloan ....................................... | 148/1.5 |
| 3,969,748 | 7/1976 | Horie et al. ............................. | 357/46 |

OTHER PUBLICATIONS

DeTroye, N.C. "Integrated Injection Logic–Present and Future" IEEE J. Solid–State Circuits, vol. SC–9, No. 5, Oct. 1974, pp. 206–211.
Hart et al., "Bipolar LSI . . . . . Integrated Injection Logic" Electronics, Oct. 3, 1974, pp. 111–118.
Hart et al., "Integrated Injection Logic" Philips Tech. Rev., 33, No. 3, 1973, pp. 76–85.

*Primary Examiner*—L. Dewayne Rutledge
*Assistant Examiner*—W. G. Saba
*Attorney, Agent, or Firm*—John T. O'Halloran; Peter C. Van Der Sluys; Vincent B. Ingrassia

[57] ABSTRACT

This relates to a method of producing a monolithic integrated I²L circuit including a bipolar analog circuit part. In order to realize good current gain values in the I²L transistors as well as high collector breakdown voltages in the analog circuit part, the base zone of the analog circuit part is prediffused prior to diffusion of the I²L base and injector regions. After such prediffusion, excessive doping material from the diffusion masking layer is removed and simultaneously windows in the diffusion mask over the I²L base and injector regions are opened. Next, doping material having a lower concentration than that which was used for the prediffusion of the analog base region is prediffused into the exposed regions of the substrate. This results in an expanded prediffused base region in the analog circuit part.

8 Claims, 9 Drawing Figures

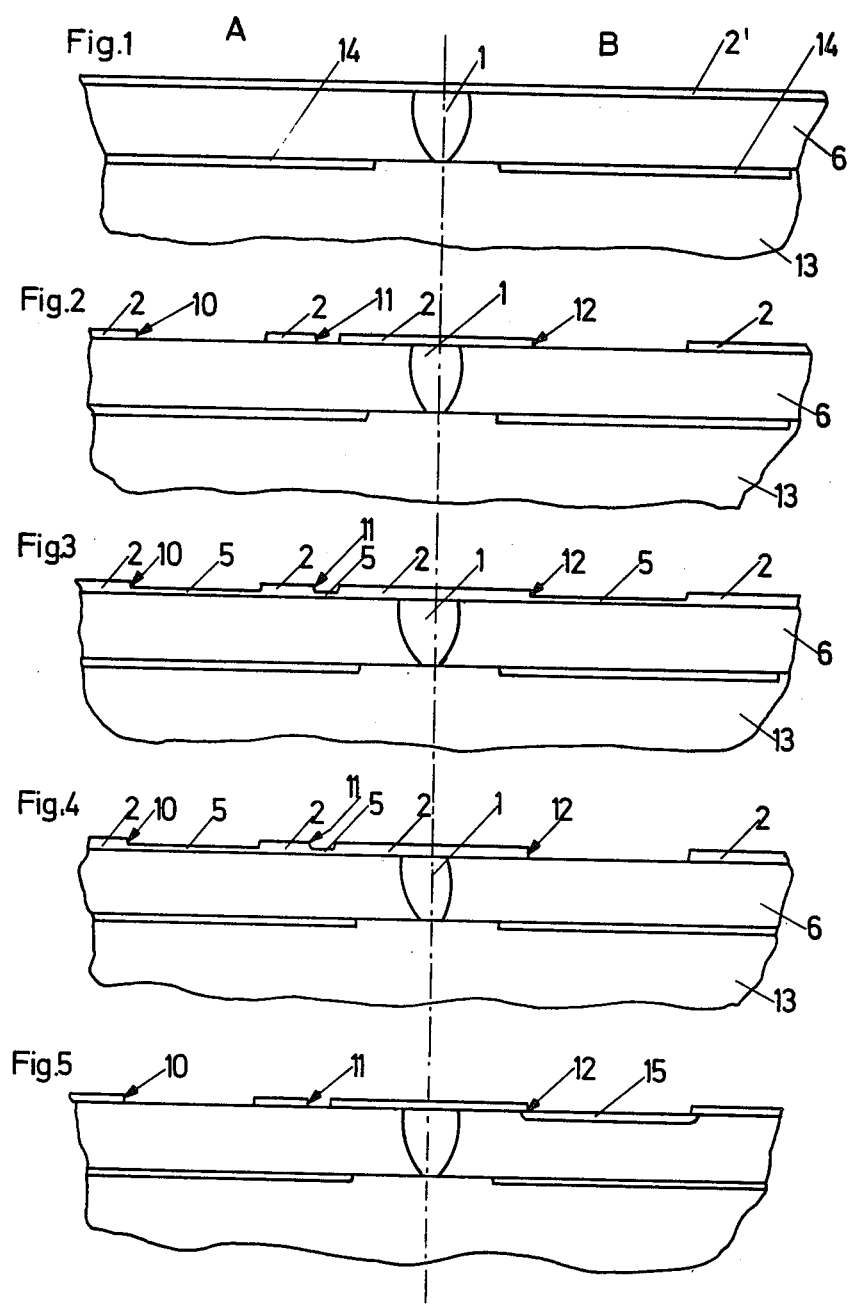

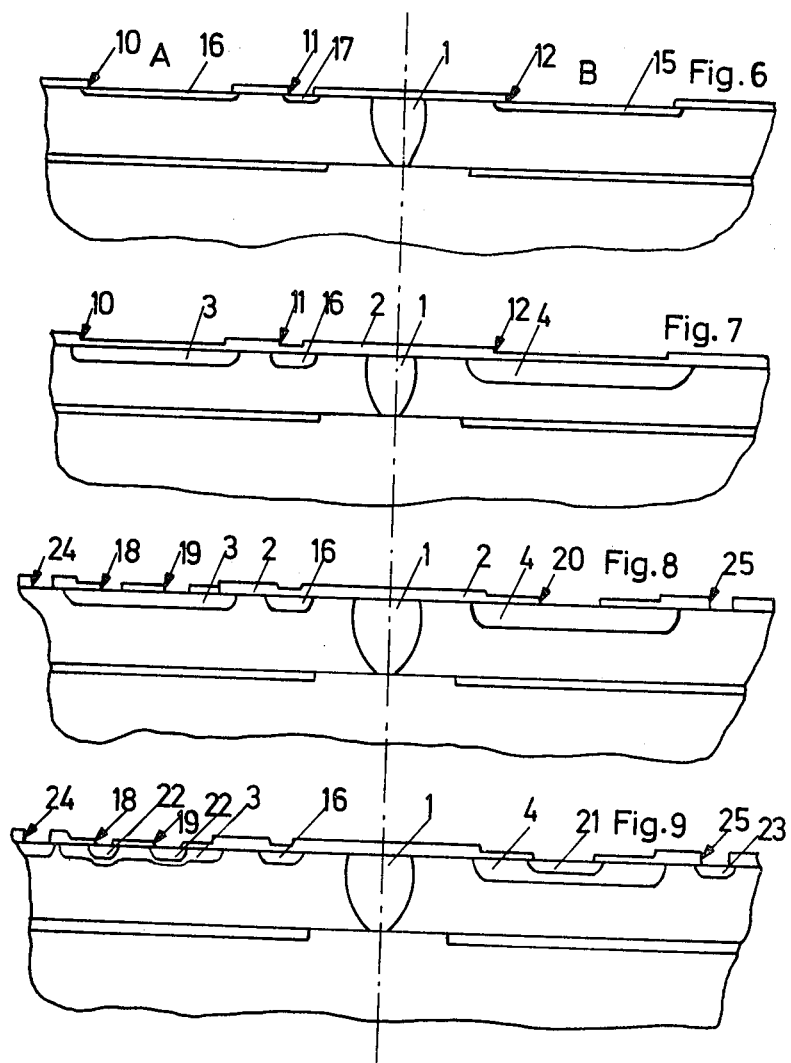

PLANAR DIFFUSION METHOD FOR AN I²L CIRCUIT INCLUDING A BIPOLAR ANALOG CIRCUIT PART

BACKGROUND OF THE INVENTION

This invention relates to the monolithic integration of an I²L circuit comprising at least one bipolar analog circuit part as known from the technical journal "Valvo-Berichte" Vol. XVIII, No. 1/2 (April 1974), pp. 215 to 216. and more particularly to the monolithic integration of an I²L circuit by employing the planar diffusion method in six masking steps.

Since, as is well known, analog circuits are operated by relatively high supply voltages, epitaxial layers of high specific resistance (e.g. 2–3Ωcm) and of great thickness (approx. 15 microns) are required. In so doing, however, the current gain values of the transistors which are required for the I²L circuit and whose collectors are arranged on the semiconductor surface, are difficult to realize.

SUMMARY OF THE INVENTION

It is an object of the present invention to realize in the I²L part a relatively high current gain value (B = IC/IB = 20 to 200) without reducing the breakdown strength in the analog circuit path.

According to a broad aspect of the invention there is provided a planar diffusion method for the monolithic integration of an I²L circuit of the type including a bipolar analog circuit part, wherein an insulating zone is diffused with dopings of a first conductivity type through an epitaxial layer of a second conductivity type, said epitaxial layer disposed on a substrate of said first conductivity type, and wherein a base zone is diffused into the epitaxial layer with dopings of said first conductivity type, and the emitter zone and collector zone of the I²L circuit are simultaneously diffused into the base zone in the course of an emitter zone diffusion, comprising: depositing a masking layer on the surface of said epitaxial layer; opening windows in said masking layer, thereby exposing said epitaxial layer; depositing a second masking layer in one of said windows of such a thickness that during a following treatment with an etching agent, the semiconductor material below said one window is again exposed; prediffusing a first doping material of said first conductivity type through the remaining windows; removing the masking layer in said one window with an etching agent; depositing a second doping material of said first conductivity type and having a concentration smaller than said first concentration on exposed regions of said epitaxial layer; and simultaneously diffusing base regions through said openings prior to emitter diffusion.

Subsequently to the deposition, the doping material of the other conductivity type, may be prediffused or else inserted by way of ion implantation.

In the method according to the invention, the diffusions corresponding to the required breakdown strength of the transistors of the bipolar analog circuit part, are inserted into an epitaxial layer of corresponding thickness and impurity concentration. Preferably, there is chosen a thickness of the epitaxial layer of more than 5 microns, for example, ranging from 5 microns to about 20 microns. As a rule, there is required a specific resistance of the epitaxial layer of more than 1Ωcm.

By the method of invention it is possible to obtain different base zone thicknesses corresponding to the different base zone concentrations of the I²L circuit part and of the bipolar analog circuit part.

The above and other objects of the present invention will be better understood from the following detailed description taken in conjunction with the accompanying drawings, in which:

BRIEF DESCRIPTION OF THE DRAWINGS

FIGS. 1 to 9 are sectional views taken vertically in relation to the surface side of a wafer-shaped semiconductor body depicting an I²L circuit A comprising a bipolar analog circuit part B during various stages of manufacture. Both parts may contain any arbitrary number of transistors.

DESCRIPTION OF THE PREFERRED EMBODIMENT

The planar diffusion method according to the invention proceeds from an arrangement according to FIG. 1 comprising an epitaxial layer 6 of one conductivity type on a substrate 13, preferably in the form of a semiconductor wafer of an opposite conductivity type. Prior to the deposition of the epitaxial layer 6, it is possible to diffuse into the semiconductor substrate 13 relatively higher doped intermediate layers 14 of the same conductivity type as that of the epitaxial layer 6, in a known manner. Through the epitaxial layer 6, an insulating zone 1 has been inserted separating part A of the I²L circuit from the bipolar analog circuit part B. On the semiconductor surface there is arranged a uniformly tight layer of a material, such as silicon dioxide which is particularly suitable for serving as the diffusion masking layer 2 in the planar diffusion method. Preferably, silicon is used as the material for both the substrate 13 and the epitaxial layer 6.

Subsequently thereto, and as shown in FIG. 2, in the course of the method according to the invention, the openings 10 and 12 for diffusing all further base zones 3 and 4 (cf. FIGS. 7 and 9) of the other conductivity type are produced in the diffusion masking layer 2.

Thereupon the base diffusion openings 10 of the I²L circuit A are closed with a masking layer 5 of such thickness that during a following treatment with an etching agent for removing excessive doping material subsequently to the deposition of dopings of the other conductivity type for producing the base zones, the semiconductor material can be exposed again within the base diffusion openings 10 of the I²L circuit A. In the given embodiment, this is carried out in that first, according to FIG. 3, all openings 10, 11 and 12, e.g. by way of thermal oxidation, are again closed with a masking layer 5 of the aforementioned thickness, and the masking layer 5 within the opening 12 is reopened for diffusing the base zone 4 of the bipolar analog circuit part B by employing the generally known photolithographic etching process. In this way there is obtained the desired structure according to FIG. 4.

Thereafter, doping material of the other conductivity type with a first concentration is deposited throughout the entire exposed surface of the arrangement, and is prediffused. Thereafter, the entire arrangement is treated with an etching agent for removing the excessive doping material from the diffusion masking layer 2, for example, by being dipped into a liquid etching agent. Owing to the specially selected thickness of the masking layer 5, the opening 5 as existing in the diffusion masking layer 2, for diffusing the base zone 3 in the part of the I²L circuit A, is simultaneously opened by exposing the semiconductor surface lying within the walls of the opening 10. At the same time, the semiconductor surface within the opening 11 is exposed for the purpose of diffusing the injector zone 16 (cf. FIGS. 7 to 9). In this way there will be obtained an arrangement according to FIG. 5 with one exposed semiconductor surface within the openings 10 and 11, and one prediffusion layer 15 for the base zone 4 within the bipolar analog circuit part B.

Subsequently thereto, doping material of the other conductivity type with a second, smaller concentration than the first concentration, is deposited onto the exposed surface. This may be effected from the gas phase or by way of ion implantation. Thereafter, this doping material of the other conductivity type may be prediffused, so that there will be obtained an arrangement according to FIG. 6 with a further expanded prediffusion layer 15 in the bipolar analog circuit part B and further prediffusion layers 16 and 17 for the base zones 3 or the injector zone 16 in the part A of the I²L circuit respectively.

Particularly favorable doping concentrations of the base zones 3 and 4 will result when the doping material of the other conductivity type is deposited in such a first concentration that subsequent to prediffusion of this doping material there will be obtained a surface resistance of 40 to 60Ω/□. Particularly favorable electrical values for solving the problem on which the invention is based, will be obtained when the doping material of the other conductivity type is deposited with such a second concentration that subsequent to prediffusion, there will result a surface resistance of 65 to 100Ω/□. Such a second prediffusion, however, is not required, as already mentioned. It may be carried out, however, exclusively for adjusting the concentration during preliminary trials.

Subsequently thereto, there is effected the actual base diffusion in the part A of the I²L circuit, together with that in the bipolar analog circuit part B, in the course of which there will be obtained an arrangement according to FIG. 7 comprising the base zones 3 and 4 and the injector zone 16 within part A of the I²L circuit. During this the openings 10, 11 and 12 in the diffusion masking layer 2 are reclosed.

In the known manner, the emitter-diffusion is carried out thereafter, during which simultaneously the emitter zone 21 and the collector contact zone 23 are diffused in the bipolar analog part B, as well as the collector zones 22 and the emitter-contact zone 21 in the part of the I²L circuit according to FIG. 9. Prior thereto, and as illustrated in FIG. 8, by employing the known photolithographic etching process, the diffusion openings 18, 19, 20, 24 and 25 are produced in the diffusion masking layer 2.

It was found that by the method according to the invention for achieving particularly suitable values, the difference in the base zone concentrations between the bipolar analog circuit part B and part A of the I²L circuit is to be adjusted in such a way that subsequently to the emitter diffusion, the transistor of part A of the I²L circuit will have a $U_{CEo}$ of at least 0.7V, or that the $U_{CEo}$-value of this transistor is distinctly smaller than the corresponding value of the bipolar analog circuit part B. Relative thereto, $U_{CEo}$ means to imply the breakpoint voltage in the $U_{CEo}/I_C$ characteristic. This rule serves to adjust and to check the two concentrations of the doping material to be applied.

The described planar diffusion method according to the invention is naturally suitable for effecting the monolithic integration of an I²L circuit comprising any arbitrary number of transistors, in part A of the I²L circuit, as well as in the bipolar analog circuit part B.

While the principles of this invention have been described above in connection with specific apparatus, it is to be understood that this description is made only by way of example and not as a limitation on the scope of the invention as set forth in the objects and features thereof and in the accompanying claims.

What is claimed is:

1. A planar diffusion method for the monolithic integration of an I²L circuit of the type including a bipolar analog circuit part including the steps of diffusing highly doped intermediate layers into a substrate, depositing an epitaxial layer on the surface of said substrate and said intermediate layers, producing an isolation region for insulating an I²L circuit part from a bipolar analog circuit part and depositing a diffusion masking layer on the surface of said epitaxial layer and said insulating region, comprising:

opening windows in said masking layer over the base and injector regions of said I²L part and the base region of said bipolar analog circuit part;

depositing a second masking layer in the windows over the base and injector regions of said I²L circuit part of such a thickness that during following treatment with an etching agent, the semiconductor material below said base and injector window is again exposed;

prediffusing a first doping material of a first concentration into the remaining opening in said bipolar analog circuit part for forming a prediffused base region;

removing excessive doping material from the diffusion masking layer and simultaneously exposing said substrate in the I²L circuit part base and injector regions;

depositing a second doping material having a concentration of smaller than said first concentration on the exposed regions of said epitaxial layer; and simultaneously diffusing the base and injector regions of said I²L circuit part and the base region of said bipolar analog circuit part prior to emitter diffusion.

2. A planar diffusion method according to claim 1 further including the step of prediffusion prior to the deposition of said second doping material of said first conductivity type having a smaller concentration.

3. A planar diffusion method according to claim 1 wherein said doping material having said smaller concentration is deposited by ion implantation.

4. A planar diffusion method according to claim 2 wherein the doping material of said first concentration results in a surface resistance of 40 to 60Ω/□ following prediffusion.

5. A planar diffusion method according to claim 4 wherein the doping material of said second concentration results in a surface resistance of 65 to 110Ω/□ following prediffusion.

6. A planar diffusion method according to claim 5 wherein said epitaxial layer has a thickness and impurity concentration corresponding to a desired dielectric strength of the transistors of said bipolar analog circuit part.

7. A planar diffusion method according to claim 5 wherein said epitaxial layer has a thickness greater than 5 microns.

8. A planar diffusion method according to claim 7 wherein said epitaxial layer has a specific resistance higher than 1Ωcm.

* * * * *